(12) United States Patent
Andreoni et al.

(10) Patent No.: US 8,153,514 B2
(45) Date of Patent: Apr. 10, 2012

(54) METHOD OF FORMING METAL/HIGH-κ GATE STACKS WITH HIGH MOBILITY

(75) Inventors: Wanda Andreoni, Adliswil (CH); Alessandro C. Callegari, Yorktown Heights, NY (US); Eduard A. Cartier, New York, NY (US); Alessandro Curioni, Gattikon (CH); Christopher P. D'Emic, Ossining, NY (US); Evgeni Gousev, Mahopac, NY (US); Michael A. Gribelyuk, Stamford, CT (US); Paul C. Jamison, Hopewell Junction, NY (US); Rajarao Jammy, Hopewell Junction, NY (US); Dianne L. Lacey, Mahopac, NY (US); Fenton R. McFeely, Ossining, NY (US); Vijay Narayanan, New York, NY (US); Carlo A. Pignedoli, Adliswil (CH); Joseph F. Shepard, Jr., Fishkill, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 12/187,767

(22) Filed: Aug. 7, 2008

(65) Prior Publication Data

US 2008/0293259 A1   Nov. 27, 2008

Related U.S. Application Data

(60) Continuation of application No. 11/513,101, filed on Aug. 30, 2006, now abandoned, which is a division of application No. 10/873,733, filed on Jun. 22, 2004, now Pat. No. 7,115,959.

(51) Int. Cl.
*H01L 21/3205* (2006.01)

(52) U.S. Cl. . 438/591; 438/216; 438/240; 257/E21.639; 257/E21.409

(58) Field of Classification Search .................. 438/151, 438/197, 216, 240, 591; 257/E21.639, E21.409
See application file for complete search history.

(56) References Cited

U.S. PATENT DOCUMENTS 6,911,381 B2    6/2005   Agarwal et al.
(Continued)

OTHER PUBLICATIONS

Schaeffer et al. "Physical and electrical properties of metal gate electrodes on HfO2 gate dielectrics," J.Va.Sci. Technol.B 21, 2003, pp. 11-17.*

(Continued)

*Primary Examiner* — Julia Slutsker
(74) *Attorney, Agent, or Firm* — Scully, Scott, Murphy & Presser PC; Louis J. Percello, Esq.

(57) ABSTRACT

The present invention provides a gate stack structure that has high mobilities and low interfacial charges as well as semiconductor devices, i.e., metal oxide semiconductor field effect transistors (MOSFETs) that include the same. In the semiconductor devices, the gate stack structure of the present invention is located between the substrate and an overlaying gate conductor. The present invention also provides a method of fabricating the inventive gate stack structure in which a high temperature annealing process (on the order of about 800° C.) is employed. The high temperature anneal used in the present invention provides a gate stack structure that has an interface state density, as measured by charge pumping, of about $8 \times 10^{10}$ charges/cm$^2$ or less, a peak mobility of about 250 cm$^2$V-s or greater and substantially no mobility degradation at about $6.0 \times 10^{12}$ inversion charges/cm$^2$ or greater.

5 Claims, 7 Drawing Sheets

U.S. PATENT DOCUMENTS

| | | | |
|---|---|---|---|
| 2002/0081862 A1* | 6/2002 | Rotondaro | 438/770 |
| 2003/0042557 A1 | 3/2003 | Shimamoto et al. | |
| 2003/0129826 A1 | 7/2003 | Werkhoven et al. | |
| 2003/0194853 A1* | 10/2003 | Jeon | 438/591 |
| 2004/0051134 A1* | 3/2004 | Jang et al. | 257/316 |
| 2004/0188778 A1 | 9/2004 | Aoyama | |
| 2005/0104142 A1* | 5/2005 | Narayanan et al. | 257/412 |
| 2005/0136586 A1* | 6/2005 | Ono | 438/216 |

OTHER PUBLICATIONS

Habas et al., "Charge-Pumping Characterization of SiO2/Si Interface in Virgin and Irradiated Power VDMOSFETs," IEEE Transaction on Electronic Devices, vol. 43, 1996, pp. 2197-2209.*

Ku, V. et al. "Low Tiny ($\leq$ 1.8 nm) Metal-Gated MOSFETs on $SiO_2$ Based Gate Dielectrics for High Performance Logic Applications." *Int. Conf. SSDM* vol. Tokyo, Japan p. 730-731 (2003).

Hiratani, Masahiko et al. "Effective Electron Mobility Reduced by Remote Charge Scattering in High-k Gate Stacks." *Jpn. J. Appl. Phys.* vol. 41 p. 4521-4522 (2002).

Fischetti, Massimo et al. "Effective Electron Mobility in Si Inversion Layers in Metal-Oxide-Semiconductor Systems with a High-k Insulator: The Role of Remote Phonon Scattering." *J. Appl. Phys.* vol. 90, No. 9 p. 4587-4601 (2001).

Callegari, A. et al. "W/$HfO_2$ Gate Stacks with Tinv~1.2nm and Low Charge Trapping." *Int. Conf. SSDM* p. 808-809 (2003).

Schaeffer, et al., "Physical and Electrical Properties of Metal Gate Electrodes on HfO2 Gate Dielectrics," J.Va. Technol. B 21, 2003, pp. 11-17.

Gusev, et al., "Ultrathin Hfo2 Films Grown on Silicon by Atomic Layer Deposition for Advanced Gate Dielectric Applications," Microelectronic Engineering, 2003, 69, pp. 145-151.

* cited by examiner

METHOD OF FORMING METAL/HIGH-κ GATE STACKS WITH HIGH MOBILITY

RELATED APPLICATIONS

This application is a continuation of U.S. application Ser. No. 11/513,101, filed on Aug. 30, 2006, which is a divisional of U.S. application Ser. No. 10/873,733, filed Jun. 22, 2004, now U.S. Pat. No. 7,115,959 issued on Oct. 3, 2006.

FIELD OF THE INVENTION

The present invention relates to a semiconductor structure and more particularly to a gate stack structure that includes an interfacial layer comprising atoms of at least silicon and oxygen and an overlaying high-k gate dielectric. The term "high-k" is used throughout the present application to denote a dielectric material that has a dielectric constant, as measured in a vacuum, that is greater than $SiO_2$. The gate stack structure of the present invention, which is annealed at a temperature of about 800° C. or above, has improved electron mobility and low interfacial charge density as compared to a conventional gate stack structure. Additionally, the present invention also relates to a method of forming the inventive gate stack structure. Moreover, the present invention provides a semiconductor device, i.e., metal oxide semiconductor field effect transistor (MOSFET), that includes at least the inventive gate stack structure.

BACKGROUND OF THE INVENTION

In the quest for improved performance, electronic circuits are becoming denser and the devices therein are becoming smaller. For example, the most common dielectric in metal oxide field effect transistors (MOSFETs) has been $SiO_2$. However as the thickness of $SiO_2$ approaches 15 Å, substantial problems appear, including, for example, leakage currents through the gate dielectric, concerns about the long-term dielectric reliability, and the difficulty in manufacturing and thickness control.

One solution to the above problem is to use thick (greater than 20 Å) films of materials, such as hafnium oxide ($HfO_2$), that have a dielectric constant that is larger than $SiO_2$. Thus, the physical thickness of the gate dielectric can be large, while the electrical equivalent thickness relative to $SiO_2$ films can be scaled.

Introduction of high-k dielectrics, such as $HfO_2$, $ZrO_2$ or $Al_2O_3$, in gate stacks has proven to reduce leakage current by several orders of magnitude. Such leakage current reduction has enabled the fabrication of complementary metal oxide semiconductor (CMOS) devices with lower power consumption. Unfortunately, other problems have arisen from utilizing high-k dielectrics in CMOS devices including difficulty of passivating the underlying silicon, the introduction of unwanted charges in the gate stack that produce large flat band voltage shifts, large threshold voltage shifts, significant charge trapping and low electron mobility devices.

Indeed, it has been reported that the electron mobilities of metal gate electrode/high-k gate dielectric stacks formed on a silicon substrate are severely degraded when compared with conventional polysilicon/$SiO_2$ gate stacks. See, for example, Callegari, et al., Int. Conf. SSDM, September 16-18, Tokyo, Japan 2003. Despite having degraded electron mobilities, the use of high-k gate dielectrics in the next generation of very large scale integrated (VLSI) circuits is necessary to reduce leakage currents in CMOS devices. Remote phonon scattering or remote charge scattering have been suggested to explain mobility degradation for nFETs. See M. V. Fischetti, et al., "Effective Electron Mobility in Si Inversion Layers in MOS systems with a High-k Insulator: The Role of Remote Phonon Scattering", J. Appl. Phys. 90, 4587 (2001) and M. Hiratani, et al. JJAP Vol. 41, p. 4521 (2002).

In high-k dielectrics, such as $HfO_2$, a metal-oxygen bond is easily polarizable under an external electric field, which results in highly undesirable scattering of channel mobile charges by remote phonons present in the high-k material. As the result, the MOS device drive current can be substantially reduced by the presence of high-k materials as the gate insulator. Several existing solutions are directed to the reduction of the scattering problem. In one known solution, a layer of silicon oxide or silicon oxynitride is disposed between the channel located within the Si substrate and the high-k gate dielectric. Some of the remote phonon scattering is reduced using these so-called interlayers because the high-k gate dielectric is positioned further away from the channel.

Although prior art gate stack structures (including a conventional interlayer and high-k dielectric) have reduced remote phonon scattering, they still do not achieve the electron mobility of MOS devices that contain $SiO_2$ as the gate dielectric. Hence, there is still a need for providing a MOS device stack, which contains a high-k gate dielectric and a metal gate, that has improved electron mobility that is substantially equivalent to conventional $SiO_2$-containing MOS devices.

SUMMARY OF THE INVENTION

The present invention provides a gate stack structure that has improved electron mobility as compared with conventional metal/high-k gate stacks. Specifically, the gate stack structure of the present invention includes an interfacial layer comprising atoms of at least Si and O and having a dielectric constant greater than $SiO_2$ and an overlaying high-k gate dielectric, said gate stack structure having an interface state density, as measured by charge pumping, of about $8\times10^{10}$ charges/$cm^2$ or less, a peak mobility of about 250 $cm^2$/V-s or greater, and substantially no mobility degradation at about $6.0\times10^{12}$ inversion charges/$cm^2$ or greater. The term "substantially no mobility degradation is used throughout the present invention to denote that the mobility at the said inversion charge level does not drop beneath the universal curve provided in FIG. 3 of the present application. No mobility degradation in the inventive gate stack structure occurs at about $8.0\times10^{12}$ inversion charges/$cm^2$ or greater.

The term "interface state density" denotes interface states located at the Si/interfacial layer interface and/or at the high-k gate dielectric/interfacial layer interface. The term "peak mobility" denotes maximum electron/hole mobility in the MOSFET channel, and the term "inversion charge" denotes the mobile charges in the MOSFET channel. The interfacial layer may contain N atoms as long as the concentration of the N atoms is about 1E15 atoms/$cm^2$ or less. More typically, the N atoms are present in the interfacial layer in a concentration from about 1E14 to about 3E15 atoms/$cm^2$. Above the broad nitrogen concentration range stated herein, degradation of the peak mobility is typically observed. The interfacial layer may also include materials from the overlaying high-k gate dielectric including, for example, metal, oxide, silicate or a mixture thereof.

In addition to the gate stack structure, the present invention also provides a semiconductor device, i.e., MOSFET, that includes at least the gate stack structure of the present invention. Specifically, the semiconductor device of the present invention comprises a semiconductor substrate, a gate stack structure comprising an overlaying high-k gate dielectric and an interfacial layer comprising at least atoms of Si and O and having a dielectric constant greater than $SiO_2$ located on a surface of said semiconductor substrate; and a gate conductor located atop the gate stack structure, wherein said gate stack structure has an interface state density, as measured by charge pumping, of about $8 \times 10^{10}$ charges/cm$^2$ or less, a peak mobility of about 250 cm$^2$/V-s or greater and substantially no mobility degradation at about $6.0 \times 10^{12}$ inversion charges/cm$^2$ or greater.

The gate stack structure of the present invention exhibits substantially no degradation in peak mobility at electron fields of about 0.8 MV/cm$^2$ or greater.

In some embodiments of the present invention, an optional diffusion barrier can be present between different gate conductor materials. The semiconductor device of the present invention may comprise a self-aligned MOSFET or a non-self-aligned MOSFET.

In addition to the above, the present invention also provides a method of fabricating the inventive gate stack structure which has the properties mentioned above. Specifically, and in broad terms, the gate stack structure of the present invention is formed by the following steps that include: providing a stack including an interlayer comprising at least atoms of Si and O and an overlying high-k gate dielectric; and annealing said stack at a temperature of about 800° C. or greater so to provide a gate stack structure having an interface state density, as measured by charge pumping, of about $8 \times 10^{10}$ charges/cm$^2$ or less, a peak mobility of about 250 cm$^2$V-s or greater and no substantially mobility degradation at about $6.0 \times 10^{12}$ inversion charges/cm$^2$ or greater.

During the annealing step, the interlayer is regrown and some intermixing with the overlaying high-k gate dielectric occurs resulting in the formation of the interfacial layer of the inventive gate stack structure. The interfacial layer of the present invention is thus different from conventional interlayers since it undergoes regrowth and intermixing which occur during the high temperature annealing step of the present invention.

The method described above can be integrated within conventional self-aligned or non-self-aligned CMOS processing steps to provide at least one MOFFET device.

DETAILED DESCRIPTION OF THE INVENTION

The present invention, which provides a gate stack structure having high mobility and low interface charge, a semiconductor device containing the same, and a method of fabricating the gate stack structure, will now be described in greater detail. Specifically, the present invention will be described in greater detail by referring to the following discussion as well as the drawings mentioned therein. It is noted that the drawings of the present application are provided for illustrative purposes and are thus not drawn to scale.

Figure 1:
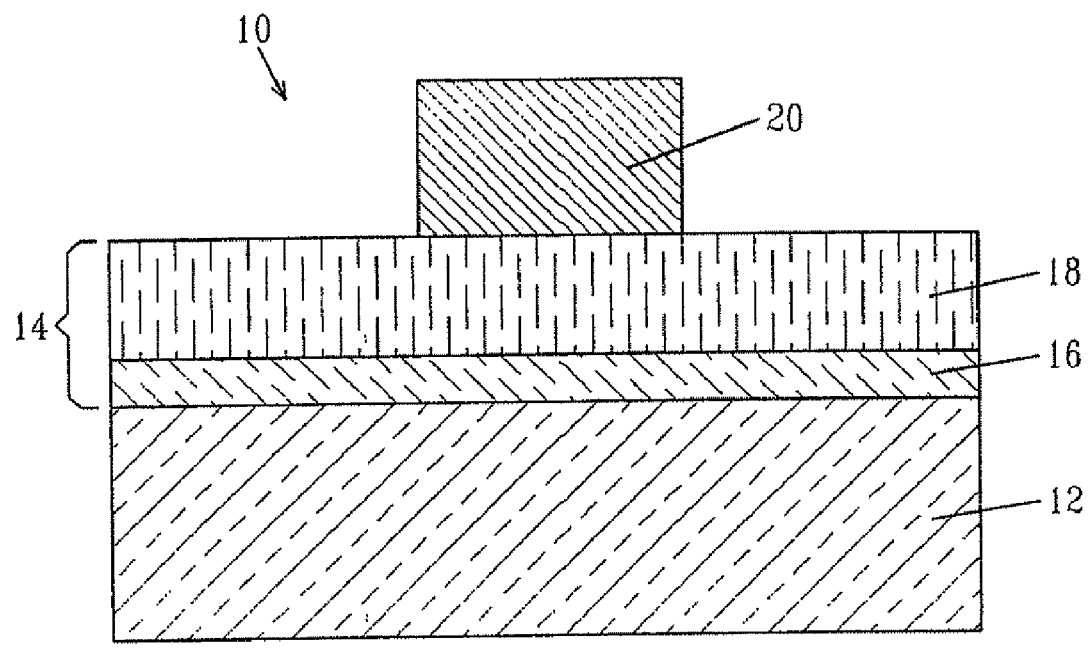
FIG. 1 is a pictorial representation (though a cross sectional view) illustrating the inventive gate stack structure positioned between a semiconductor substrate and a gate conductor.

Reference is first made to the structure 10 shown in FIG. 1 which includes the gate stack structure 14 of the present invention. Specifically, the structure 10 shown in FIG. 1 comprises a semiconductor substrate 12, the inventive gate stack structure 14 located on a surface of the semiconductor substrate 12 and a gate conductor 20 located atop the gate stack structure 14. In accordance with the present invention, the gate stack structure 14 shown in FIG. 1 comprises an interfacial layer 16 and an overlaying high-k gate dielectric 18. The interfacial layer 16 is positioned between the high-k gate dielectric 18 and the semiconductor substrate 12, hence the gate conductor 20 is located atop the high-k gate dielectric 18. In some embodiments, not shown in this drawing, a metal diffusion barrier can be positioned between different gate conductor materials.

The semiconductor substrate 12 of structure 10 comprises any semiconductor material including, for example, Si, SiGe, SiGeC, SiC, GaAs, InAs, InP, and other III/V or II/VI compound semiconductors. The semiconductor substrate 12 may also comprise layered semiconductors such as Si/SiGe, Si/SiC, silicon-on-insulators (SOIs), or silicon germanium-on-insulators (SGOI). In a preferred embodiment of the present invention, the semiconductor substrate 12 is a Si-containing semiconductor material.

The semiconductor substrate 12 may be doped, undoped or contain doped and undoped regions therein. The semiconductor substrate 12 may also include a first doped (n- or p-) region, and a second doped (n- or p-) region. For clarity, the doped regions are not specifically labeled in this drawing of the present application. The first doped region and the second doped region may be the same, or they may have different conductivities and/or doping concentrations. These doped regions are known as "wells". A well region is shown in FIGS. 2A-2D and is labeled as reference numeral 11.

Trench isolation regions (not specifically shown) are typically formed in the semiconductor substrate 12 at this point of the present invention utilizing conventional processes well known to those skilled in the art. The trench isolation regions are located to the periphery of the region shown in this drawing and they are used to isolate various devices from each other. See, for example, FIG. 2D.

The interfacial layer 16 of gate stack structure 14 comprises a layer that includes at least atoms of Si and O. In addition to these atoms, the interfacial layer 16 may include N atoms, as well as metals, oxides, silicates or mixtures thereof; the latter elements, i.e., metals, oxides, and silicates, are from the overlying high-k dielectric 18. The elements from the overlaying high-k dielectric 18 are introduced into the interfacial layer 16 during the annealing step of the present application, which will be described in greater detail below.

The interfacial layer 16 is also characterized as having a dielectric constant that is greater than $SiO_2$. More typically, the interfacial layer 16 has a dielectric constant from about 4.5 to about 20.

It is noted that when the interfacial layer 16 contains N atoms, the concentration of N atoms present therein should be relatively low. By "relatively low", it is meant a N atom concentration of about 1E15 atoms/$cm^2$ or less. More typically, the interfacial layer 16 may have a N concentration from about 1E14 to about 3E15 atoms/$cm^2$. The relative low concentration of N atoms is needed since a high content of N atoms within the interfacial layer 16 will degrade the mobility of the gate stack structure.

The amount of metal, particularly Hf, present within the interfacial layer 16 is typically from about 1 to about 80 atomic percent as defined as %[metal/(metal+Si)], with an amount from about 3 to about 15 atomic percent being more typical. The O content within the interfacial layer 16 is typically from about 50 to about 65 atomic percent, with an O content from about 60 to about 65 atomic percent being more typical. Depending on the material used in fabricating the inventive gate stack structure 14, the interfacial layer 16 may comprise $SiO_x$, $Si_aO_bN_c$ and/or a silicate. The Si within the interfacial layer 16 may be distributed evenly throughout the entire layer or it can be graded.

The interfacial interlayer 16 of the present invention is a thin layer whose thickness is typically less than 20 Å. More typically, the interfacial layer 16 has a thickness from about 5 to about 15 Å.

The high-k gate dielectric 18 of the inventive gate stack structure 14 comprises any dielectric material that has a dielectric constant that is greater than $SiO_2$, preferably greater than 7.0. Examples of such high such high-k dielectrics, include, but are not limited to: binary metal oxides such as $TiO_2$, $Ta_2O_5$, $Al_2O_3$, $Y_2O_3$, $ZrO_2$, $HfO_2$, $Gd_2O_3$, and $La_2O_3$; silicates and aluminates of said binary metal oxides; and perovskite-type oxides. Combinations and/or multilayers of such high-k dielectrics are also contemplated herein. The perovskite-type oxides may be in a crystalline or an amorphous phase.

Examples of perovskite-oxides that may be employed in the present invention as the high-k dielectric material 18 include, but are not limited to: a titanate system material, i.e., barium titanate, strontium titanate, barium strontium titanate, lead titanate, lead zirconate titanate, lead lanthanum zirconate titanate, barium zirconium titanate and barium lanthanum titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, and barium titanium niobate; or a Bi-layered perovskite system material such as strontium bismuth tantalate, and bismuth titanate.

Of the various high-k dielectrics mentioned above, preference is given to Hf-based high-k dielectrics such as, for example, $HfO_2$ and hafnium silicate. In embodiments in which the high-k dielectric 18 comprises a silicate, Si may be distributed evenly throughout the entire layer or it can be graded.

In some embodiments of the present invention, both the interfacial layer 16 and the high-k gate dielectric 18 contain Si that is graded in each of the layers.

The thickness of the high-k dielectric 18 may vary depending on the dielectric constant of the material and the method in which the high-k dielectric was deposited. Typically, the high-k dielectric 18 has a thickness from about 5 to about 50 Å, with a thickness from about 15 to about 30 Å being more typical.

Due to the methodology employed in the present invention in fabricating the gate stack structure 14, the gate stack structure 14 has an interface state density of about $8\times10^{10}$ charges/$cm^2$ or less. More typically, the gate stack structure 14 of the present invention has an interface state density of about $5\times10^8$ charges/$cm^2$ or less. The interface state density is measured using a charge pumping technique that is well known to those skilled in the art.

Another characteristic of the inventive gate stack 14 is that it has a peak mobility that is typically about 250 $cm^2$/V-s or greater, and more typically about 260 $cm^2$/V-s or greater. The peak mobility is determined by combining the integrated inversion charge derived by split CV (capacitance-voltage) method and drive current at a Vdrain-source=30 mV.

In addition to having a low interface state density and a high peak mobility, the inventive gate stack structure 14 has substantially no mobility degradation at about $6.0\times10^{12}$ inversion charges/$cm^2$ or greater. The inversion charge is determined in the present invention by integration of CV characteristics such as shown, for example, in FIG. 7. No mobility degradation occurs at about $8.0\times10^{12}$ inversion charges/$cm^2$ or greater.

Unlike prior art gate stack structures, the gate stack structure 14 of the present invention does not exhibit any significant degradation in peak mobility when operating at an electron field of about 0.8 MV/$cm^2$ or greater.

The gate conductor 20 shown in FIG. 1 comprises a conductive material including, but not limited to: elemental metals such as W, Pt, Pd, Ru, Re, Ir, Ta, Mo or combinations and multilayers thereof; silicides of the foregoing elemental metals; nitrides of the foregoing elemental metals that may optionally contain silicon; polysilicon either doped or undoped; and combinations and multilayers thereof. For example, the gate conductor 20 may comprise polysilicon (doped or undoped) and a metal. In one embodiment of the present invention, W is employed as the gate conductor 20.

In some embodiments, especially when the gate conductor 20 comprises polySi/metal, an optional diffusion barrier (not shown in FIG. 1) is employed between the two gate conductors. The optional metal diffusion barrier comprises any material that is capable of preventing metal from outdiffusing into the polySi gate conductor. Examples of optional metal diffusion barriers that can be employed in the present invention include, but are not limited to: Ti, TiN, Ta, TaN, WN, TaSiN and multilayers thereof. When present, the optional diffusion barrier layer typically has a thickness from about 50 to about 500 Å. More typically, the optional metal diffusion barrier has a thickness from about 100 to about 300 Å.

The structure shown in FIG. 1 is fabricated by first forming an interlayer layer comprising atoms of Si and O on a surface of the semiconductor substrate 12. Specifically, the interlayer employed in the present invention may comprise $SiO_2$, SiON, or a combination including multilayers thereof. The interlayer can be formed by thermal means such as oxidation or oxynitridation, or it can be formed by a deposition process such as atomic layer deposition, chemical solution deposition, and the like. Alternatively, an SiON interlayer can be formed by first growing a $SiO_2$ layer by a rapid thermal oxidation process and then subjecting the grown oxide layer to plasma nitridation. The conditions used in forming the interlayer are conventional and can be selected by one skilled in the art to obtain an interlayer having a thickness from about 3 to about 15 Å.

Next, the high-k gate dielectric 18 is formed atop the interlayer utilizing a conventional deposition process such as, for example, chemical vapor deposition (CVD), plasma-enhanced chemical vapor deposition (PECVD), atomic layer deposition (ALD), rapid thermal CVD, sputtering, evaporation, chemical solution deposition and other like deposition processes. In addition to the conventional means described above, the process described in co-pending and co-assigned U.S. patent application Ser. No. 10/291,334, filed Nov. 8, 2002 can be used in depositing the high-k gate dielectric 18 on the interlayer. The entire content of the aforementioned patent application is incorporated herein by reference.

In some embodiments, not shown, the layers can be subjected to a patterning step which includes conventional lithography and etching. The patterning may be preformed after deposition of each layer or following deposition of multilayers including, for example, the interlayer, high-k gate dielectric, optional metal diffusion barrier and gate conductor. FIG. 1, for example, only shows the gate conductor 20 as being a patterned layer.

Next, gate conductor 20 is typically formed atop the high-k gate dielectric 18 by utilizing a conventional deposition process including, but not limited to: CVD, PECVD, sputtering, chemical solution deposition, plating and the like. When doped polysilicon is employed as the gate conductor 20, the doped polysilicon layer can be formed utilizing an in-situ doping deposition process or by first depositing an undoped polysilicon layer and then doping the undoped polysilicon by ion implantation.

When an optional metal diffusion barrier is employed, a metal gate conductor is first deposited and then the optional diffusion barrier is formed via a conventional deposition process. Following deposition of the optional diffusion barrier, a polysilicon gate conductor can be formed atop the metal diffusion barrier.

In accordance with the present invention, the structure including at least the interlayer and high-k gate dielectric is subjected to a high temperature annealing process. Specifically, the annealing step employed in the present invention is capable of converting the interlayer into the interfacial layer 16 of the present invention. Specifically, the annealing step of the present invention causes some regrowth of the interlayer and subsequent intermixing with the overlying high-k gate dielectric. In accordance with the present invention, the annealing step is performed at a temperature of about 800° C. or greater. More typically, annealing is performed at a temperature from about 900° to about 1100° C., with a temperature range from about 950° to about 1050° C. being even more typical. The annealing step is performed in an inert ambient including, for example, He, Ne, Ar, $N_2$ or a mixture thereof. A forming gas ambient may also be employed. Preferably, the annealing is performed in $N_2$. The anneal may include various ramp-up rates, soak cycles, cool-down rates and various ambients or the same ambient can be employed. In one embodiment, which is preferred, the anneal is performed at 1000° C. in $N_2$ and then a 450° C. second anneal in a forming gas ambient follows.

The annealing times can vary and can be selected by one skilled in the art. Typically, annealing is performed in the present invention for a time period from about 15 to about 60 minutes. Shorter anneal times can be used if a rapid thermal anneal, spike anneal or laser anneal are employed. The time period provided is for a typical furnace anneal.

The above process can be integrated with any conventional CMOS process including for example a process for fabricating a self-aligned MOSFET and a process for fabricating a non-self-aligned MOSFET. The self-aligned and non-self-aligned process are conventional and are thus well known to those skilled in the art. Since these processes are well-known, a detail discussion concerning each of the different techniques is not provided herein.

Figure 2A:
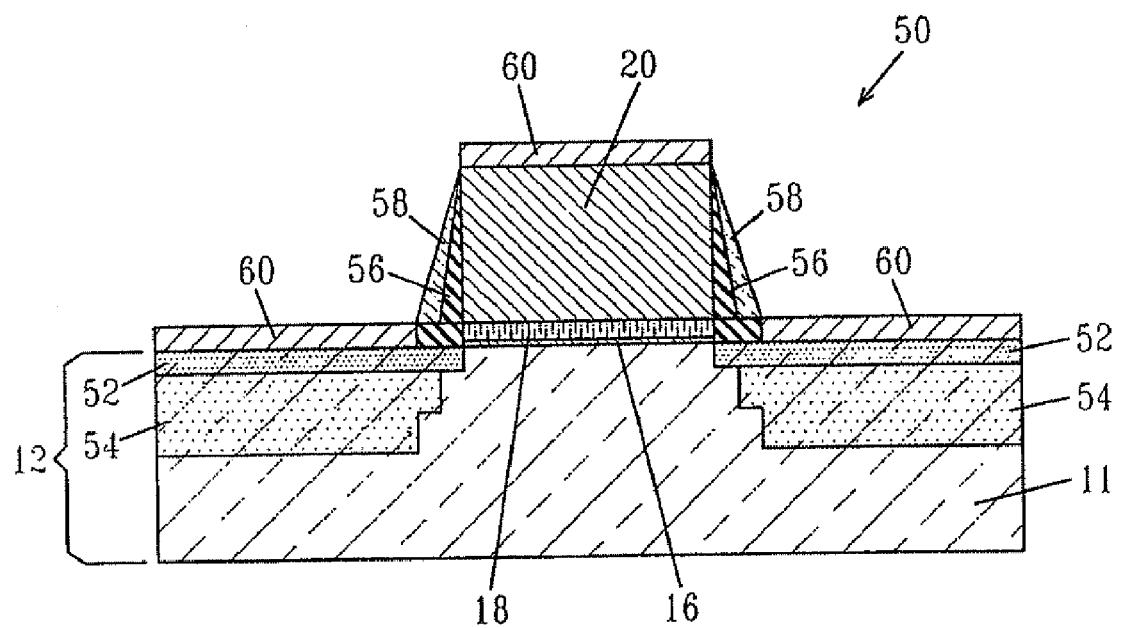
FIGS. 2A-2D are pictorial representations (through cross sectional views) illustrating various MOSFET devices that can include the inventive gate stack structure.
Figure 2B:
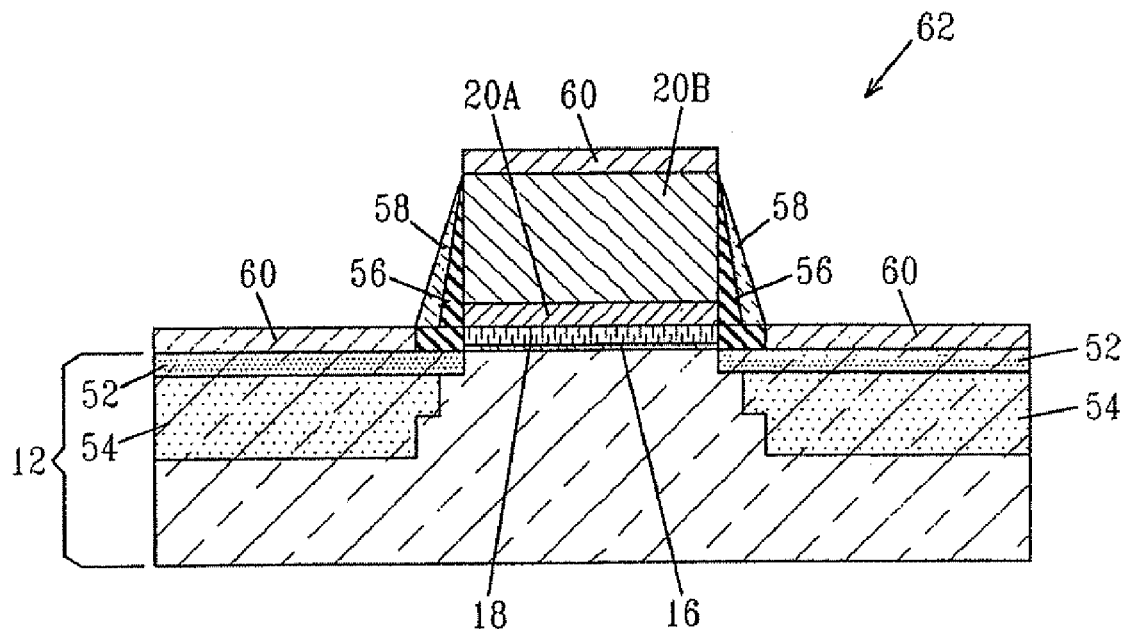
Figure 2C:
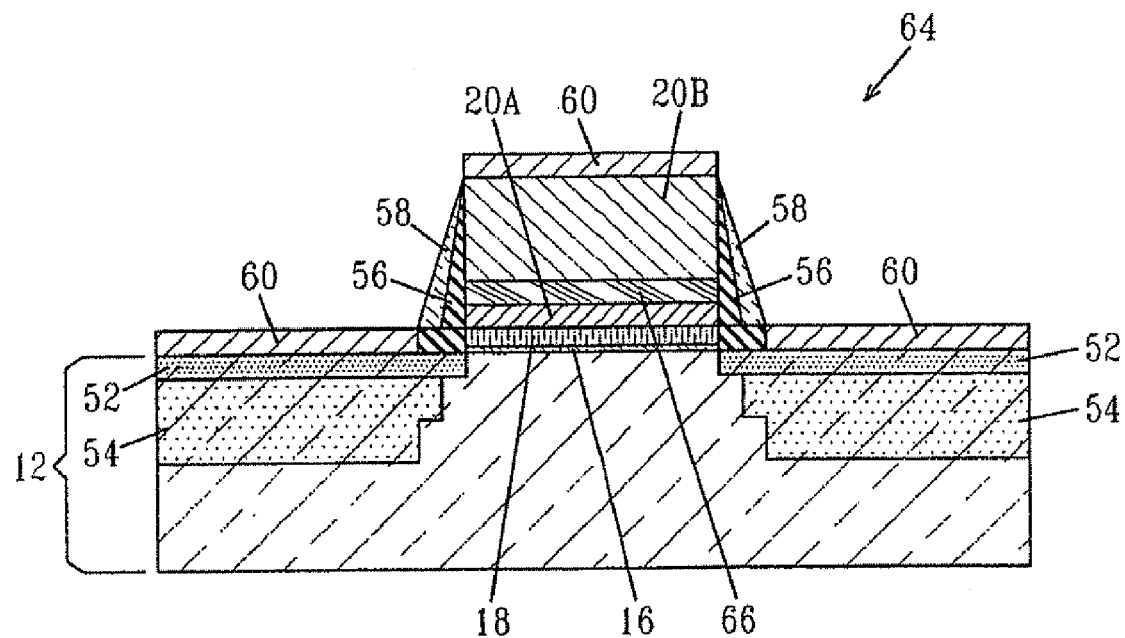

FIGS. 2A-2C show self-aligned MOSFETs that are fabricated using a self-aligned process in which the above described processing steps are integrated therein. Specifically, FIG. 2A illustrates a gate metal self-aligned MOSFET 50 that includes substrate 12 having well regions 11, extension regions 52, and source/drain regions 54 formed therein. Atop substrate 12 is interfacial layer 16, high-k dielectric 18, and metal gate conductor 20. A pair of insulating spacers 56 and 58 are shown protecting the sidewalls of layers 16, 18 and 20. The structure 50 also includes silicide regions 60 that are formed by a conventional silicidation process.

FIG. 2B is similar to the structure shown in FIG. 2A except that the gate conductor comprises a stack of a metal gate conductor 20A and a polysilicon gate conductor 20B. The structure shown in FIG. 2B is a polySi/gate metal self-aligned MOSFET 62. Insofar as FIG. 2C is concerned, there is shown a polySi/metal diffusion/gate metal self-aligned MOSFET 64. This structure is similar to the one depicted in FIG. 2B except for the presence of metal diffusion barrier 66.

Figure 2D:
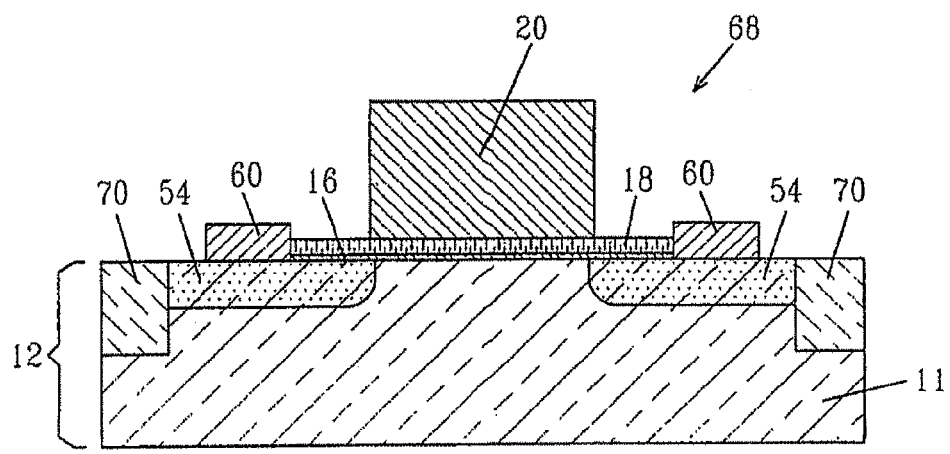

FIG. 2D shows a non-self aligned metal gate structure 68 that includes substrate 12, well region 11, source/drain regions 54, interfacial layer 16, high-k gate dielectric 18, gate conductor 20 and silicide contacts 60. Trench isolation regions 70 are also shown in this drawing as well. The non-self-aligned structure 68 is formed using conventional non-self-aligned processes in which the processing steps described above have been integrated therein.

It is emphasized that in the above structures, the inventive gate stack structure including the annealed interlayer 16 and high-k gate dielectric 18 has an interface state density, as measured by charge pumping, of about $8 \times 10^{10}$ charges/cm$^2$ or less, a peak mobility of about 250 cm$^2$/V-s or greater, and substantially no mobility degradation at about $6.0 \times 10^{12}$ inversion charges/cm$^2$ or greater.

The following examples are provided for illustrative purposes and show some of the advantages that can be achieved from the invention gate stack structure.

Example 1

This example is provided to show that the degradation in electronic mobilities within a metal-high-k gate stack can be reduced significantly when the gate stack is annealed at high temperature and an interfacial layer with a higher dielectric constant than $SiO_2$ is formed. W/HfO$_2$ gate stacks were formed by metal organic chemical vapor deposition (MOCVD) on thin $SiO_2$ interfacial layers on bulk Si substrates. NMOS were fabricated by using a non-self-aligned gate process, as described by Callegari, et al., SSDM, Tokyo, Japan 2003, pp. 809-809. The gate stacks were then characterized by mobility measurements using 20×5 mm$^2$ FETs with channel doping of about $4 \times 10^{17}$ B/cm$^3$. Inversion charge was derived by a split CV method and drain currents were measured at $V_{ds}$=30 mV.

Figure 3:
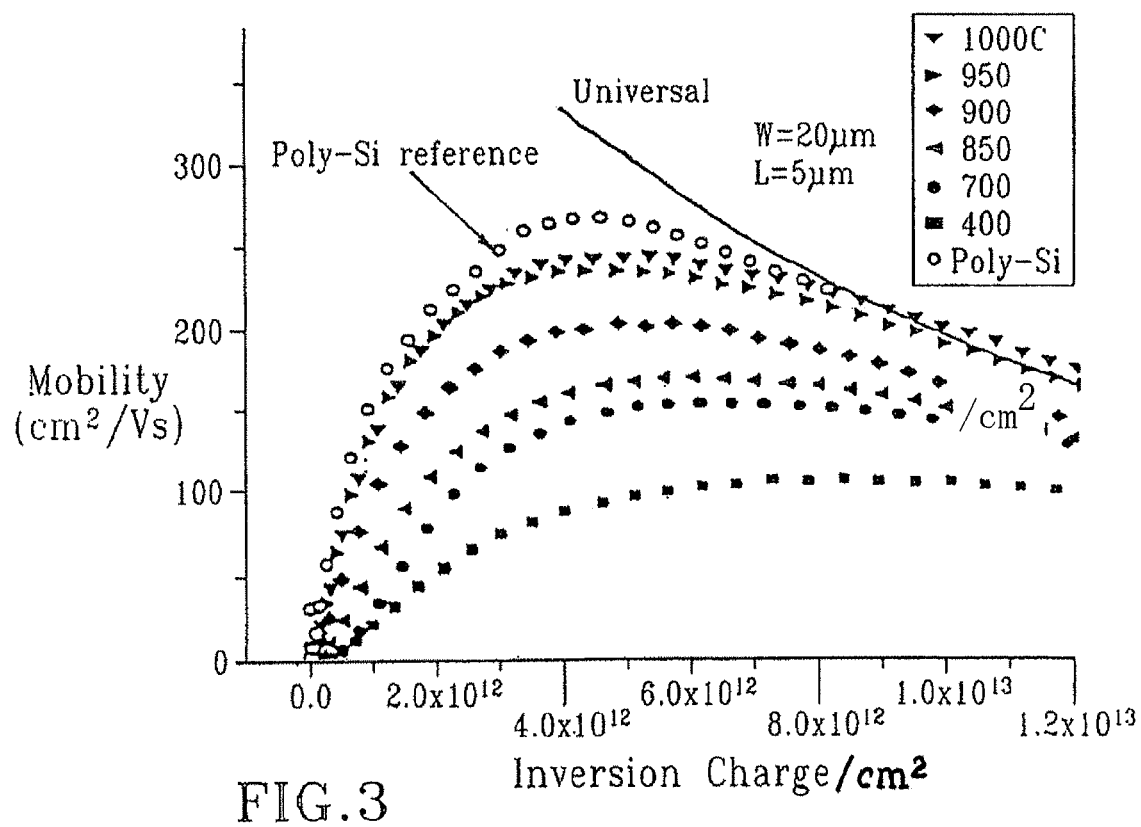
FIG. 3 is a plot showing the mobilities of a W/HfO$_2$ gate stack annealed at different temperatures from 400° C. to 1000° C.
Figure 4:
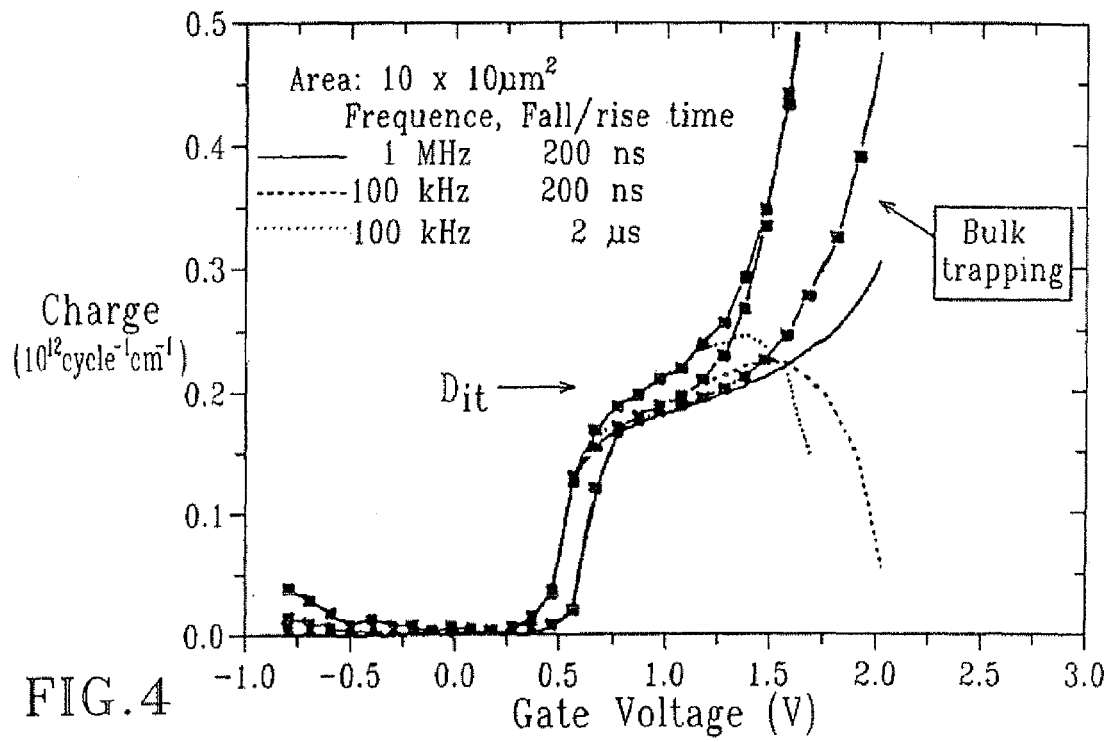
FIG. 4 is a plot showing the charge pumping curves of a gate stack annealed at 400° C.
Figure 5:
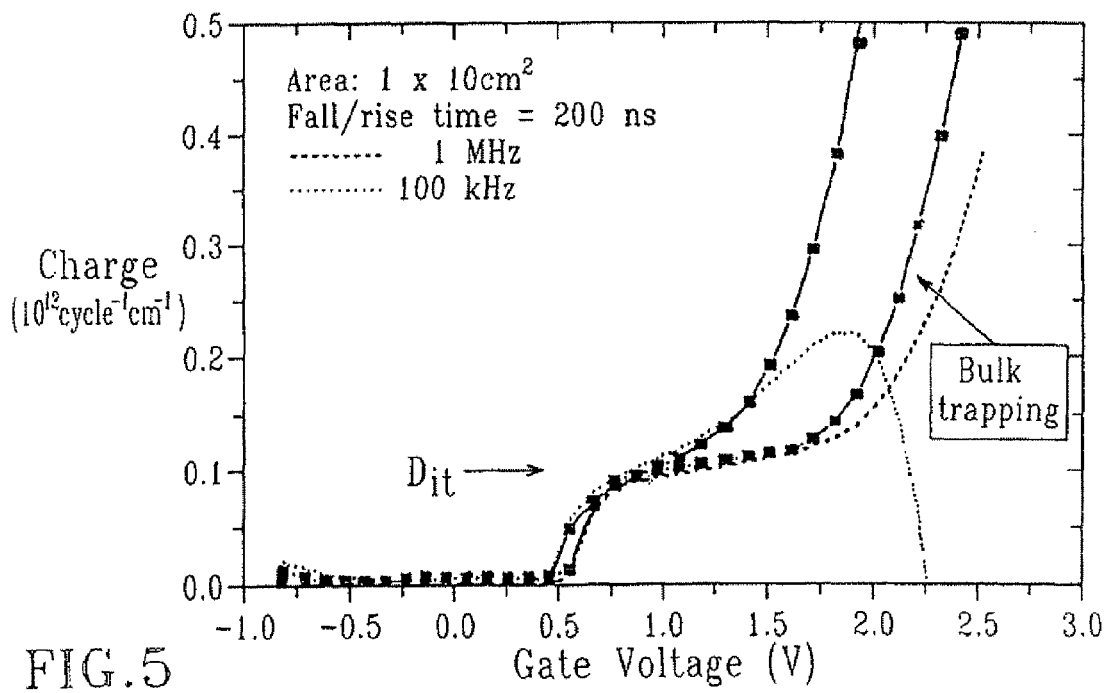
FIG. 5 is a plot showing the charge pumping curves of a gate stack annealed at 800° C.
Figure 6:
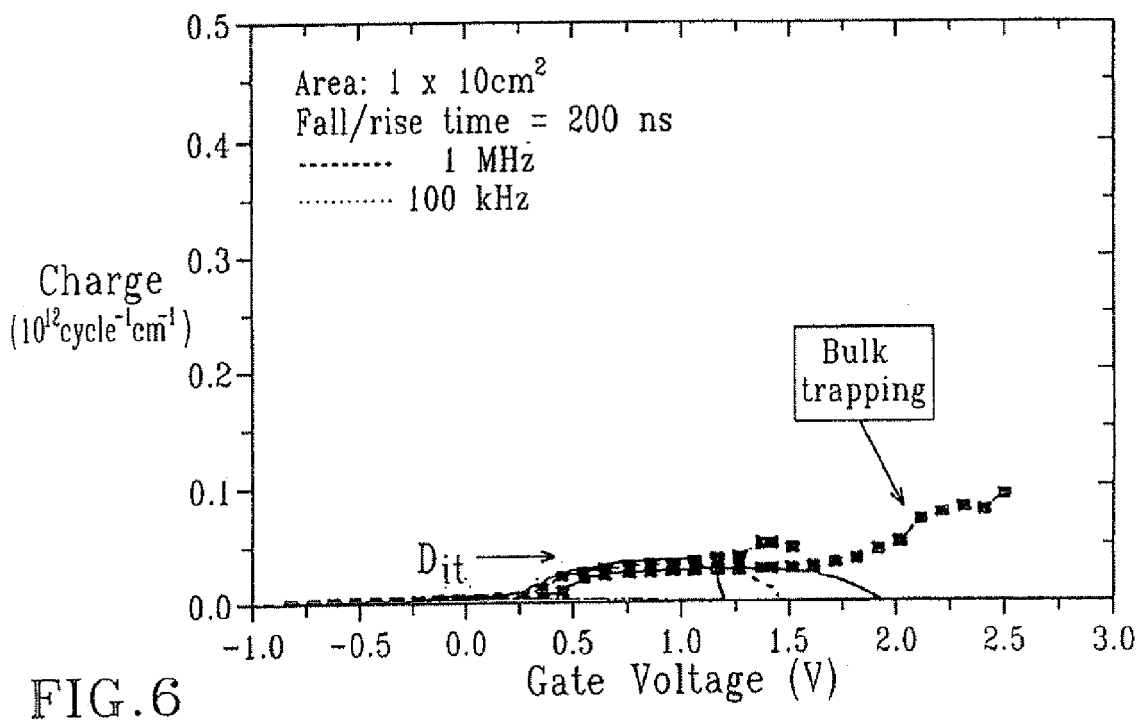
FIG. 6 is a plot showing the charge pumping curves of a gate stack annealed at 1000° C.

FIG. 3 shows a set of mobility curves for a W/HfO$_2$ gate stack as a function of increasing annealing temperature. At low annealing temperatures (less than 800° C.), mobilities were severely degraded. Electron peak mobilities significantly improved from about 100 to about 260 cm$^2$/V-s as the stack was subjected to a high temperature anneal. Charge pumping curves were also measured on these samples to see if mobility improvement was related to interface states density reduction. Charge pumping curve characteristics for a gate stack annealed at different temperatures are shown in FIGS. 4, 5 and 6. In FIG. 4, which is outside the annealing temperature of the present invention, interface states densities were of the order of about $2\times10^{11}$ charges/cm² with a peak mobility about 100 cm²/V-s. It should be emphasized that this quite low value for the peak mobility for HfO₂ is not consistent with an SiO₂ monitor which has $m_{peak}$ of about 300 cm²/V-s at about the same density of interfacial states. Thus, interfacial states alone can not justify the strong mobility degradation when high k materials are used. Other phenomena must be present.

By increasing the annealing temperature, the interface state densities are decreasing to about $8\times10^{10}$ charges/cm² (FIG. 5) consistent with improved peak mobility. At the highest annealing temperature (1000° C.) used in this example, charge pumping characteristics indicated that interface states densities decreased to about $5\times10^{10}$ charges/cm² (See, FIG. 6). Also, there was not much evidence of bulk traps.

Peak mobility increased to about 256 cm²/V-s and this value compared very well with a poly-Si control. Inversion layer thicknesses were measured by split CV (See FIG. 7) as a function of annealing temperature. $T_{inv}$ increased from about 1.4 nm to 1.95 nm with annealing temperature. Note, also, from FIG. 8 that gate leakage reduction (in inversion) from a poly-Si/SiON monitor decreased from about three orders of magnitude to two orders of magnitude at high annealing temperature.

Figure 7:
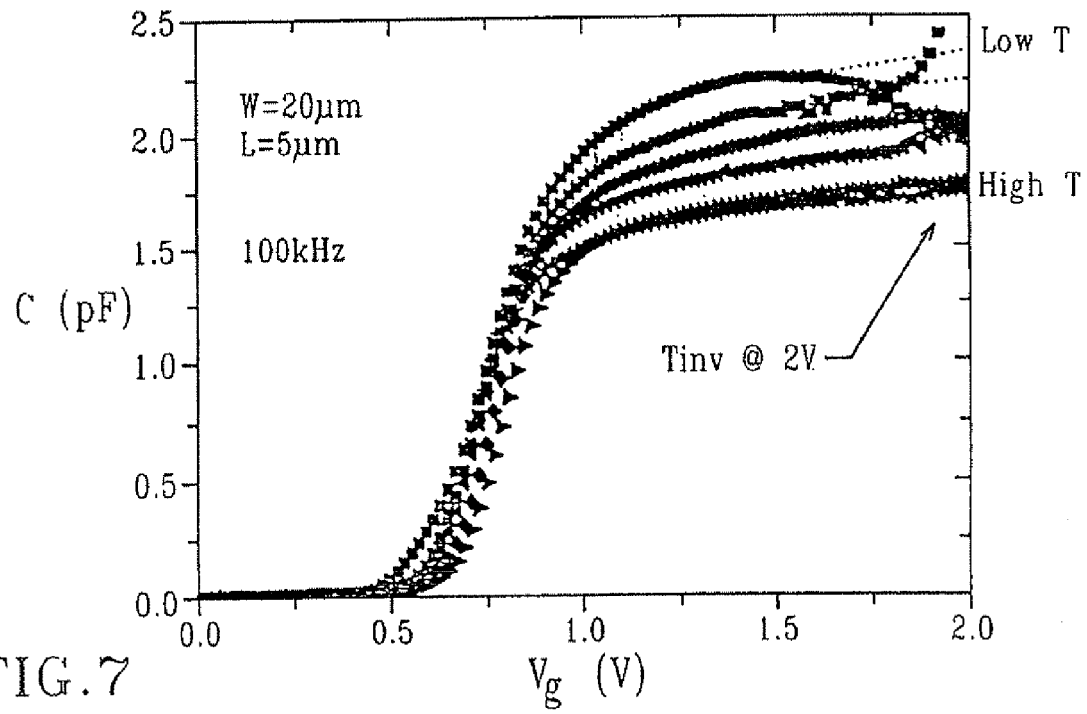
FIG. 7 is a plot of split CVs at different annealing temperatures T.
Figure 8:
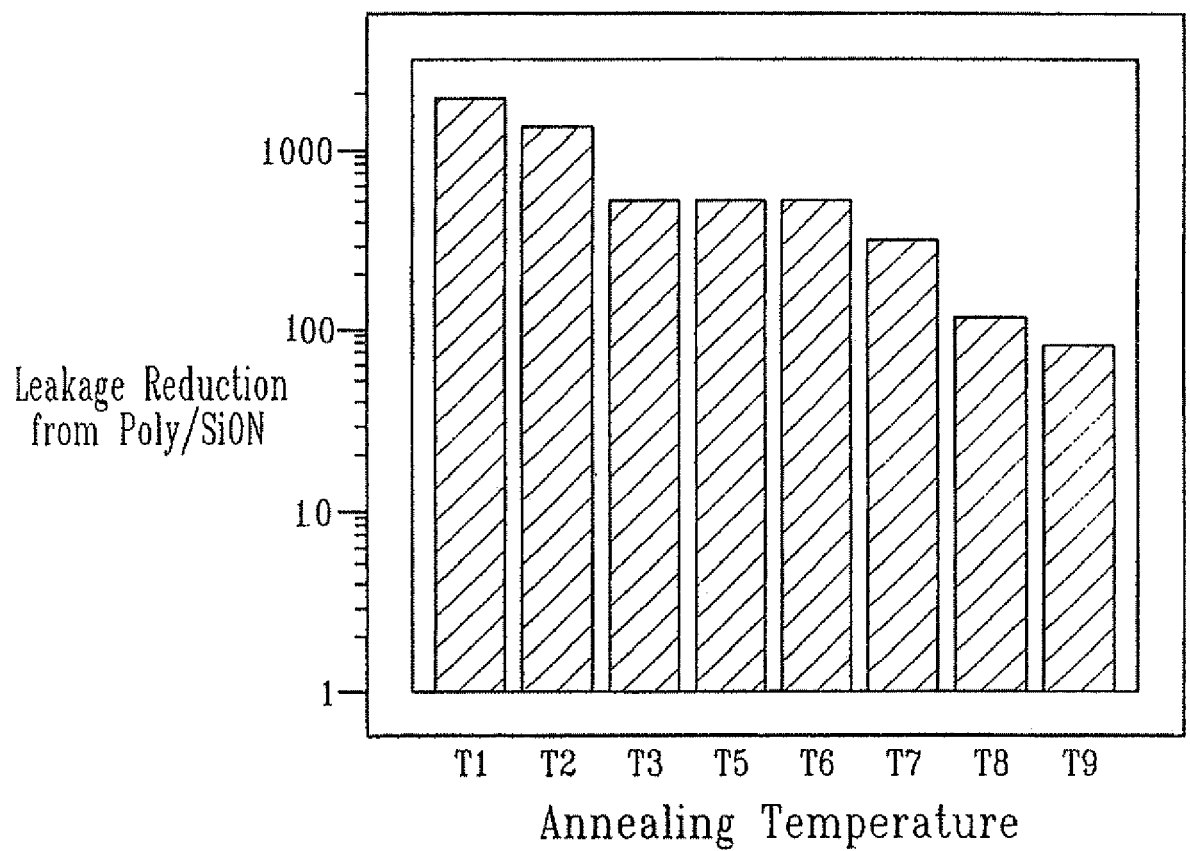
FIG. 8 is a bar graph showing the leakage reduction at different annealing temperatures; T1 as deposited, T2 and T3 at 700° C., 5 seconds and 60 seconds, respectively, T5-T9 at 800°-1000° C. for 5 seconds using 50° C. steps.
Figure 9:
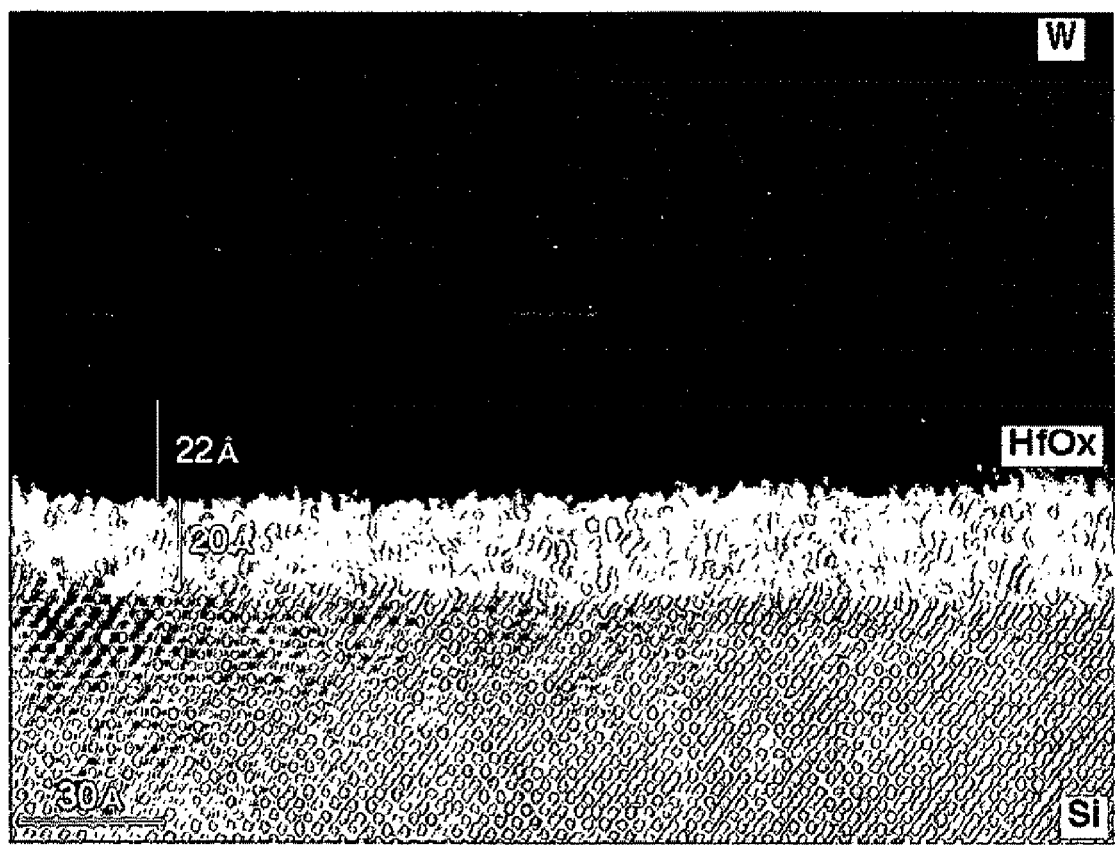
FIG. 9 is an actual TEM of a W/HfO$_2$/interfacial layer stack after 1000° C. anneal.

At a first glance, it appeared that the mobility improvement observed in FIG. 3 may be due to SiO₂ interfacial layer regrowth. In order to investigate this point, another set of samples were prepared with a thicker interfacial layer. As in the previous sample, peak mobility increased with annealing temperature. Here, $T_{inv}$ increased from about 2.0 nm to about 2.4 nm with similar leakage reduction behavior observed in FIG. 5. Note that the mobilities of the gate stack with a thicker interfacial layer were consistent with results reported previously. On the contrary, when the stacks were formed on a thinner interfacial layer all the mobilities values of FIG. 3 were shifted to a higher level. Thus, it appeared that interfacial layer regrowth with annealing temperature was not the only cause for the mobility improvement. It is speculated that the gate stack of the present invention must go through some structural change. This speculation can be validated by the TEM picture of FIG. 9, which shows that the SiO₂ interfacial layer after a 1000° C. anneal is about 20 Å (starting target thickness was about 7 Å) and the HfO₂ thickness was about 22 Å. These values are not consistent with a $T_{inv}$ about 1.95 nm (FIG. 7). Also, note from FIG. 8 that the decrease in leakage reduction from three to two orders of magnitude followed a staircase pattern with temperature. This is another indication that the gate stack was structurally changing with annealing temperature.

Example 2

In example, a doped silicon substrate was prepared as usual for semiconductor processing. The substrate was cleaned and a thin oxide layer was grown in a liquid chemical bath containing a mixture of water, hydrogen peroxide and ammonium hydroxide which was controlled to a temperature between 20°-40° C., preferably 35° C. Subsequently, and preferably immediately, the substrate was placed into a vacuum chamber and heated to a temperature of 250°-650° C., preferably 500° C. A Hf containing metal organic precursor was delivered into the chamber and to the substrate through a showerhead. The chamber ambient may contain one or more of the following gasses: nitrogen, helium, oxygen, argon or other inert gasses preferably N₂ and oxygen. The total gas pressure in the reactor was controlled to between 50 mT and 5 T, preferably 300 mT. In this fashion, a thin film consisting of hafnium oxide is grown on the substrate to between 5 and 200 Å thick (preferably 25 Å) depending on amount of the time the substrate remains in the chamber.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim is:

1. A method of forming a gate stack structure having enhanced mobility comprising:
   providing a stack including an interlayer comprising at least atoms of Si and O and a Hf-containing high-k gate dielectric located on an upper surface of said interlayer; and
   converting said stack into a gate stack structure including a regrown and intermixed interlayer comprising Hf in atomic weight % ranging from 3% to 15%, O in an atomic weight % ranging from 50% to 65%, nitrogen in an amount from $1\times10^{14}$ atoms/cm² to $3\times10^{15}$ atoms/cm², and a remainder of Si, said gate stack structure having an interface state density, as measured by charge pumping, of about $8\times10^{10}$ charges/cm² or less, a peak mobility of about 250 cm²/V-s or greater and substantially no mobility degradation at about $6.0\times10^{12}$ inversion charges/cm² or greater, wherein said converting includes annealing said stack at a temperature of about 800° C. or greater.

2. The method of claim 1 wherein said annealing is conducted in an inert ambient, a forming gas ambient or a combination thereof.

3. The method of claim 1 wherein said temperature is about 900° to about 1100° C.

4. The method of claim 1 wherein said providing and annealing step are integrated into a self-aligned MOSFET process.

5. The method of claim 1 wherein said providing and annealing step are integrated into a non-self-aligned MOSFET process.

* * * * *